United States Patent
Everts et al.

(10) Patent No.: US 6,856,939 B2
(45) Date of Patent: Feb. 15, 2005

(54) FAULT ASSESSMENT USING FRACTIONAL FAILURE RATES

(75) Inventors: Franklin F. Everts, Boulder, CO (US); Robert A. Shimbo, Longmont, CO (US); Judith W. Koslov, Longmont, CO (US)

(73) Assignee: Sun Microsystems, Inc., Santa Clara, CA (US)

( * ) Notice: Subject to any disclaimer, the term of this patent is extended or adjusted under 35 U.S.C. 154(b) by 96 days.

(21) Appl. No.: 10/341,031

(22) Filed: Jan. 13, 2003

(65) Prior Publication Data

US 2004/0138852 A1 Jul. 15, 2004

(51) Int. Cl.[7] .............................................. G06F 15/00
(52) U.S. Cl. ...................................... 702/179; 714/799
(58) Field of Search .......................... 702/60, 117, 118, 702/176, 178–185, 193, 34; 714/8, 37, 797; 705/29; 324/752, 765, 73.1, 750, 751

(56) References Cited

U.S. PATENT DOCUMENTS

| | | | | |
|---|---|---|---|---|
| 5,442,545 A | * | 8/1995 | Matsui et al. .................. | 705/29 |
| 6,085,154 A | * | 7/2000 | Leuthausser et al. ......... | 702/34 |
| 6,295,727 B1 | * | 10/2001 | Huang et al. .................. | 29/832 |
| 6,470,479 B1 | * | 10/2002 | Yamamoto ..................... | 716/4 |
| 6,549,022 B1 | | 4/2003 | Cole, Jr. et al. ............. | 324/752 |
| 6,587,960 B1 | * | 7/2003 | Barford et al. ................ | 714/8 |
| 6,671,634 B2 | * | 12/2003 | Koutlev et al. ............... | 702/60 |
| 6,781,151 B2 | | 8/2004 | Schultz et al. ................ | 257/48 |
| 6,789,032 B2 | | 9/2004 | Barbour et al. ............... | 702/81 |
| 2002/0174384 A1 | * | 11/2002 | Graichen et al. ............. | 714/37 |
| 2003/0028352 A1 | * | 2/2003 | Puthucode ..................... | 702/181 |
| 2003/0041301 A1 | * | 2/2003 | Ryoo et al. .................. | 714/797 |

* cited by examiner

*Primary Examiner*—Patrick Assouad
*Assistant Examiner*—Mohamed Charioui
(74) *Attorney, Agent, or Firm*—Meyertons Hood Kivlin Kowert & Goetzel, P.C.; B. Noël Kivlin

(57) ABSTRACT

A method for determining a fractional failure rate in an electronic system. In one embodiment, the method includes identifying a fault in the electronic system. The method may then identify a list of circuit connections for signals associated with the fault. Once the list of circuit connections are identified, a component fractional failure rate may be determined for a component to which the fault is associated. The method may also include determining a fractional failure rate for a circuit carrier (e.g. a printed circuit board, or PCB). A fault fractional failure rate may be determined by adding the component fractional failure rate to the circuit carrier fractional failure rate. The fault fractional failure rate may indicate a percentage of an overall system failure rate to which the particular fault contributes. The method may be applied to electronic systems where multiple components or system units may contribute to the particular fault.

23 Claims, 5 Drawing Sheets

US 6,856,939 B2

FAULT ASSESSMENT USING FRACTIONAL FAILURE RATES

BACKGROUND OF THE INVENTION

1. Field of the Invention

This invention relates to electronic systems, and more particularly, reliability calculations and fault isolation in electronic systems.

2. Description of the Related Art

One important metric for computers and other types of electronic systems is reliability. Customer expectations for product reliability are a critical factor that must be considered for a company that produces electronic systems. As such, an important part of the design process may involve the performance of reliability calculations.

Reliability calculations include several factors. One such factor is MTBF, or Mean Time Between Failures. MTBF may be considered as one measure of product reliability, indicating the number of hours a part or system is expected to operate before failing. In general, higher MTBF figures indicate a more reliable system. One method of calculating MTBF may be found by taking the inverse of the sum of all the system part failure rates, or $1/(\Sigma$ part failure rates).

Determining the individual part failure rates for an electronic system may involve partitioning the system into its constituent cards buses, power supplies and other electrical and mechanical devices. The failure rates from the constituent system parts may be used to derive an overall failure rate. However, such a methodology may not always yield enough information to accurately predict system reliability. Furthermore, this methodology does not identify any information about the likelihood of a specific system component being the source of a particular system failure.

SUMMARY OF THE INVENTION

A method for determining a fractional failure rate in an electronic system is disclosed. In one embodiment, the method includes identifying a fault in the electronic system. The method may then identify a list of circuit connections (i.e. a netlist) for signals associated with the fault. Once the list of circuit connections is identified, a component fractional failure rate may be determined for a component with which the fault is associated. The method may also include determining a fractional failure rate for a circuit carrier (e.g. a printed circuit board, or PCB). A fault fractional failure rate may be determined by adding the component fractional failure rate to the circuit carrier fractional failure rate. The fault fractional failure rate may indicate a percentage of an overall system failure rate to which the particular fault contributes. The method may be applied to electronic systems where multiple components or system units may contribute to the particular fault.

BRIEF DESCRIPTION OF THE DRAWINGS

Other aspects of the invention will become apparent upon reading the following detailed description and upon reference to the accompanying drawings in which.

Figure 1:
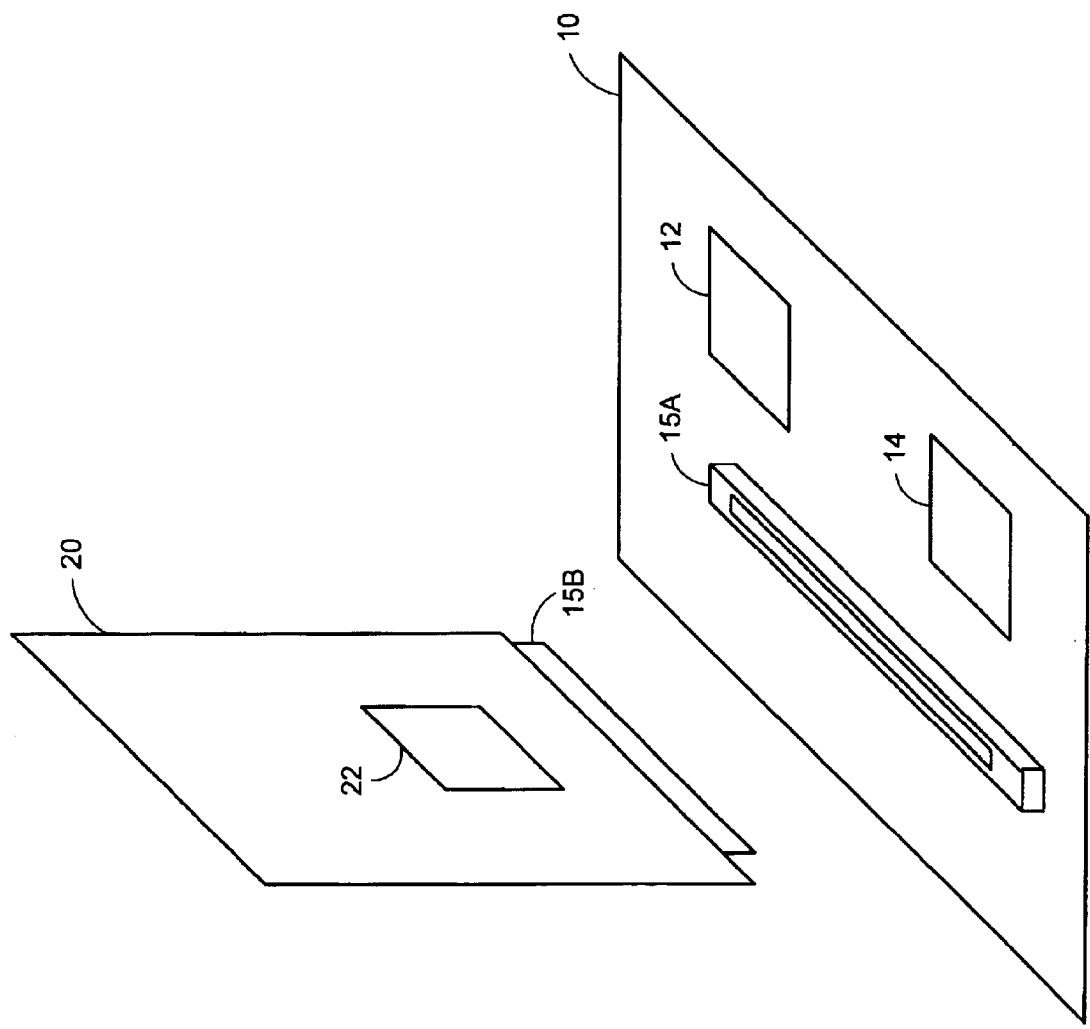
FIG. 1 is a drawing of one embodiment of two circuit cards of a computer system coupled together by complementary connectors.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives failing with the spirit and scope of the present invention as defined by the appended claims.

DETAILED DESCRIPTION OF THE INVENTION

Turning now to FIG. 1, a drawing of one embodiment of two circuit cards of a computer system coupled together by complementary connectors is shown. In the embodiment shown, circuit card 10 and circuit card 20 are configured to be coupled together by complementary connectors (e.g. female and male connectors) 15A and 15B. Circuit cards 10 and 20 may be part of an electronic system, such as a computer system, a digital signal processing system, or virtually any other type. In addition to circuit cards, the method to be described herein may also be applicable to other types of circuit carriers, such as multi-chip modules or ceramic hybrids. A method for determining fractional failure rates for electronic systems such as the exemplary system shown in FIG. 1 will be discussed in further detail below.

It should be noted that the failure rates used herein are rates per million hours. For example, a failure rate of 2.0 means two failures for every million hours of operation. Other embodiments are possible and contemplated wherein the failure rate is determined in thousands of hours, billions of hours, and so on.

Circuit card 10 may include integrated circuits (IC's) 12 and 14, while circuit card 20 may include IC 22. Each of the IC's may include various mechanisms for indicating a fault. For example, the IC's may include parity checking mechanisms that provide an indication of incorrect parity of a group of transferred bits. The indication of the fault may be displayed on a monitor or other type of human interface.

Two or more of the IC's may be coupled together by a plurality of signal lines (not shown here). Thus, faults that appear on a particular IC may appear on another when their respective signal lines are shared. This may be true for IC's on the same circuit card or on different circuit cards. For example, if IC 14 on circuit card 10 shares signal lines with IC 22 on circuit card 20, a fault affecting any of the connecting circuit lines may appear on (i.e. be indicated as present by) both IC's. Since the respective connectors of circuits cards 10 and 20 may represent a system boundary, the fault may be considered to cross boundaries. Thus, fractional failure rates for a fault that crosses system boundaries may be calculated for each unit (or circuit card in this example) individually or as a whole of the system units upon which the fault appears.

In some situations, certain circuit patterns may be isomorphic replications. Such an example is a memory bus coupled to several memory devices or memory modules in a computer system. The pattern of address lines, data lines, and control lines may be repeated with each device/module.

Another example of isomorphic patterns would include a computer system having multiple processors with the same types of signal connections. Considerations of the presence of isomorphic signal patterns may be necessary to accurately determine fractional failure rates.

Figure 2:
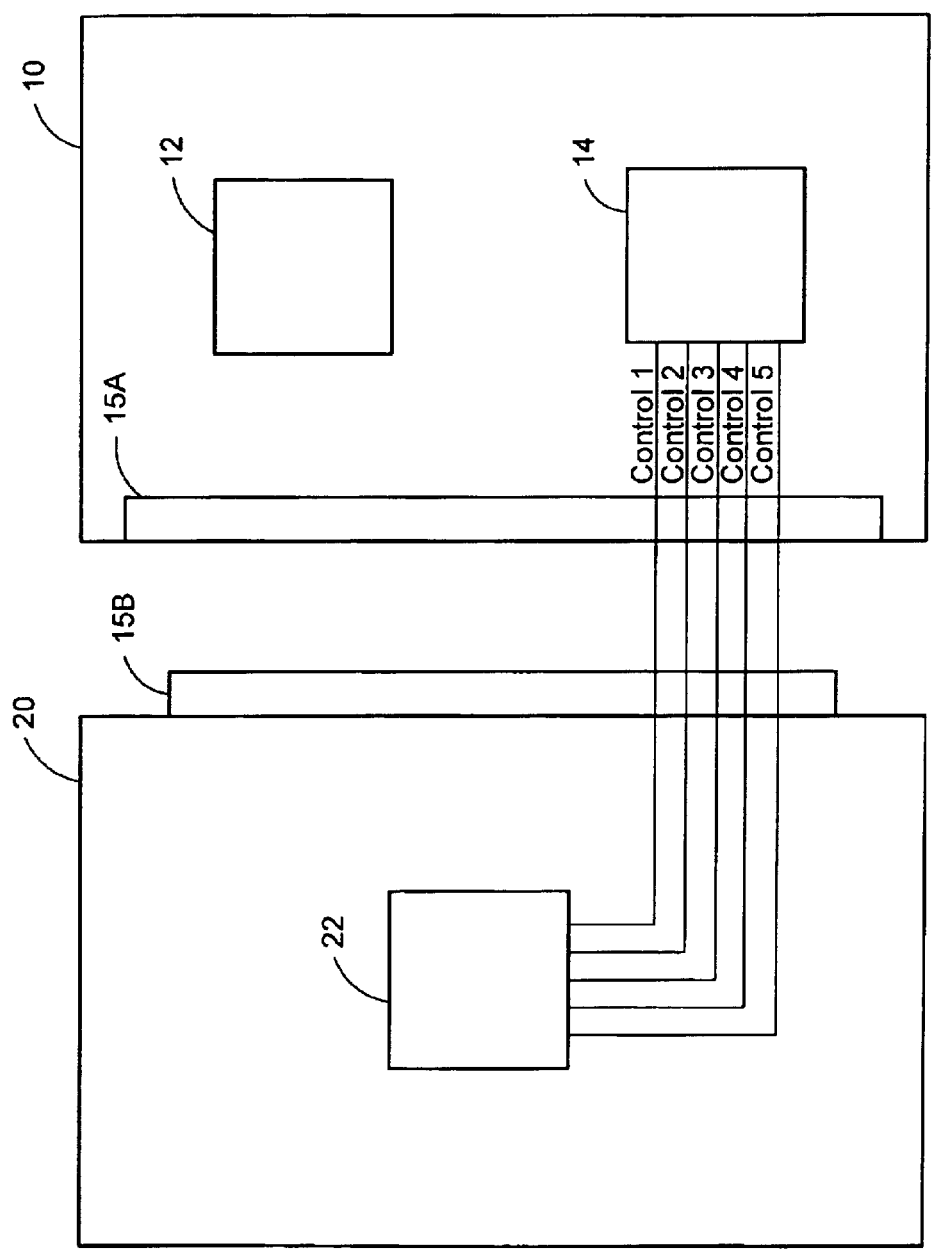
FIG. 2 is a block diagram of one embodiment of two units of a computer system coupled together.

Moving now to FIG. 2, a block diagram of one embodiment of two units of a computer system coupled together is shown. This particular embodiment is analogous to the circuit cards shown in FIG. 1, although other embodiments are possible and contemplated (including embodiments having multi-chip modules and/or ceramic hybrids). As with FIG. 1, circuit cards 10 and 20 may be coupled to each other by complementary connectors 15A and 15B. Both IC's 14 and 22 are coupled to each other via signal lines Control 1–Control 5, via connectors 15A and 15B. A fault in IC 14 that is associated with these signal lines may also appear to be associated with IC 22 when circuit cards 10 and 20 are coupled together. Thus, when considering the fractional failure rate for this particular fault, it may be necessary to add the fractional failure rates for the fault relative to each circuit card.

Figure 3A:
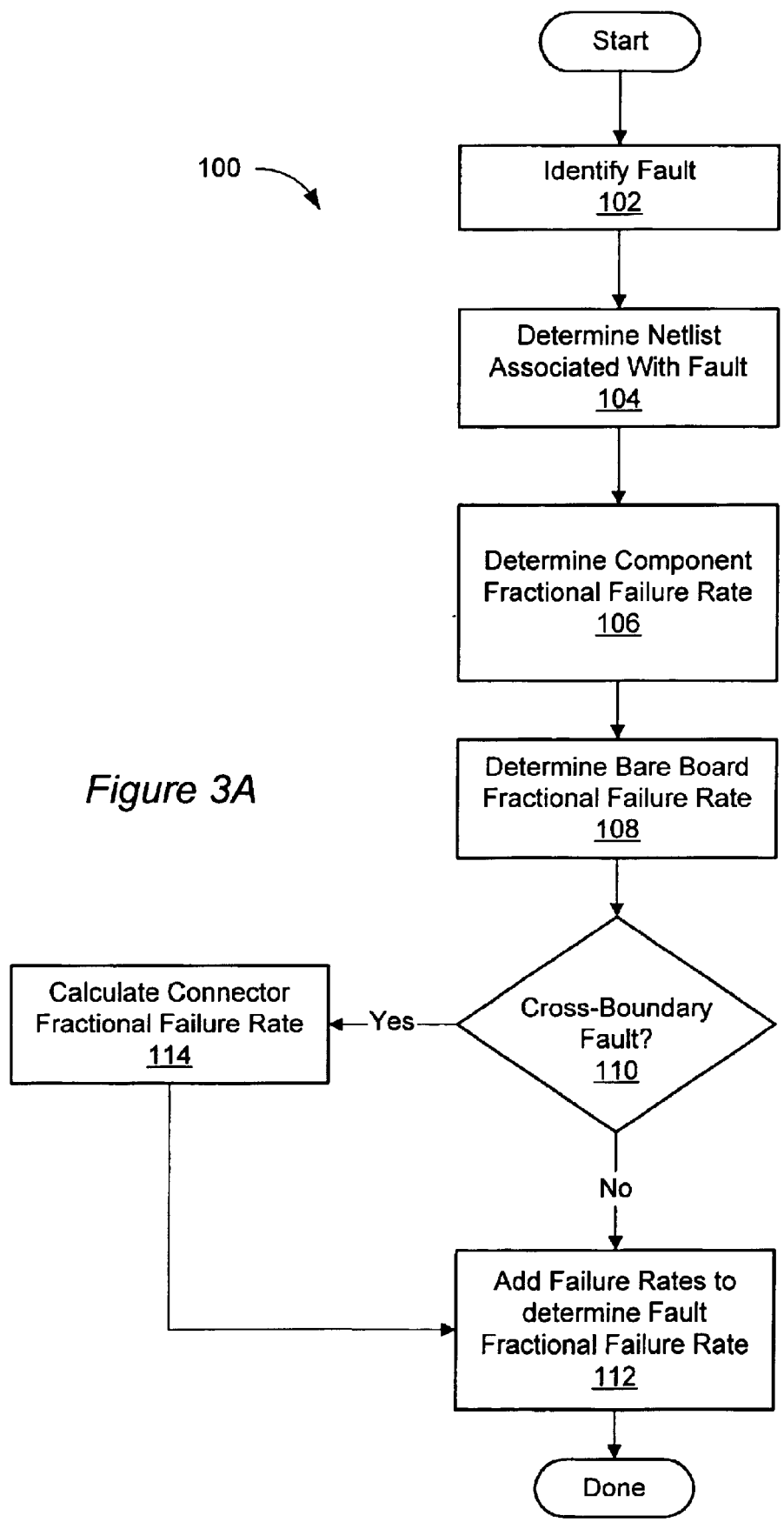
FIG. 3A is a flow diagram of one embodiment of a methodology for determining a fractional failure rate for a single system unit.

Turning now to FIG. 3A a flow diagram of one embodiment of a methodology for determining a fractional failure rate for a single system unit is shown. An example of a fractional failure rate calculation relative to the embodiments presented in FIGS. 1 and 2 will be presented herein along with the explanation of the method.

Method 100 begins with the identification of a fault (102) and the determination of a netlist (104) or list of circuit connections associated with the fault. For example, a control fault with IC 14 of FIG. 2, associated with control lines 1-5 may be identified as a fault that may occur during operation of the system. Upon identifying a control fault, a netlist identifying other components may be determined. In this case, the netlist includes IC 14 and connector 15A of circuit card 10 along with connector 15B and IC 22 of circuit card 20.

With the netlist identified, a component fractional failure rate can be found (106). In one embodiment, the calculation of the component fractional failure rate may include determining the fraction of the failure rate that is apportioned to the considered fault. This portion may be found by the formula $$F_1 = \frac{(\text{pins\_implicated})}{(\text{total\_active})};$$

wherein $F_1$ is the portion of component failures due to the implicated pins, pins_implicated is the number of pins implicated in the fault, and total_active is the total number of active pins on the component. Active pins may include any input pin, output pin, or bi-directional pin. In some embodiments, power pins, ground pins, and any no-connect pins may be excluded from the number of active pins. For the purposes of this example, it is assumed that IC 14 has 504 active signal pins. Thus, the component fractional failure rate for this particular fault is:

$$F_1 = \frac{5}{504} = 0.0099.$$

Thus, the fraction of the failures of IC 14 associated with pins Control 1–Control 5 id 0.0099 or 0.99%. This number may be multiplied by a component failure rate, which may be supplied by a manufacturer of the component. The component failure rate may be measured as an expected number of failures over a certain number of hours of operation (e.g. 1 failure per million hours of operation). For this example, assuming the failure rate is 0.25 failure per million hours of operation, the component fractional failure rate is 0.25*0.0099=0.0025.

A bare board (or other circuit carrier, e.g. multi-chip module, ceramic hybrid, etc.) fractional failure rate may also be determined (108). The bare board fractional failure rate may represent a portion of the bare board failure rate that is allocated to the component upon which the failure occurs. The fractional failure rate may be found by first taking the inverse of the number of active components on the board, or 1/N, where N is the number of active components. For the purposes of this example, assume that circuit card 10 includes a total of (not all of which are shown in FIGS. 1 and 2) 28 IC's and 32 dual inline memory modules (DIMMS). The total number of active components is 60, and thus the inverse is 1/60 or 0.0167.

The bare board failure rate must be also be considered to arrive at the bare board fractional failure rate, which will be assumed to be 2.59 for this example. Taking the product P of the bare board failure rate with the inverse of the number of active components, we have P=2.59*0.0167=0.0433.

To arrive at the fractional failure rate, the ratio of implicated pins to the total number of active pins is multiplied by the product above. For this example, the ratio of implicated pins to the total number of pins found above was 0.0099, while the product P found above was 0.0433. Thus, the bare board failure rate=0.0099*0.0433=0.000429.

It should be noted that in some cases the particular fault for which the fractional failure rate is being calculated may affect more than one component on the board. In such cases, the calculation may be repeated for each component affected and the failure rates added for a total bare board fractional failure rate.

As noted above, some types of faults/failures may cross boundaries. For this example, a boundary may be considered to be present at the connectors which couple circuit card 10 to circuit card 20 as shown in FIGS. 1 and 2. If the failure is a cross-boundary failure, a decision is made to calculate a connector fractional failure rate (110). The connector fractional failure rate may be calculated to yield a portion of the total fractional failure rate to which the connector contributes (114). In reference to FIG. 3A, the connector fractional failure rate will not be considered. However, an example of a connector fractional failure rate calculation will be given in reference to FIG. 3B.

Once the individual failure rates have been calculated, the total fault fractional failure rate may be determined (112). The fault fractional failure rate may be determined by adding the individual failure rates. For this example, the component fractional failure rate was 0.0025, while the bare board fractional failure rate was found to be 0.00429. Adding these figures together, the total fault fractional failure rate is 0.00679.

Figure 3B:
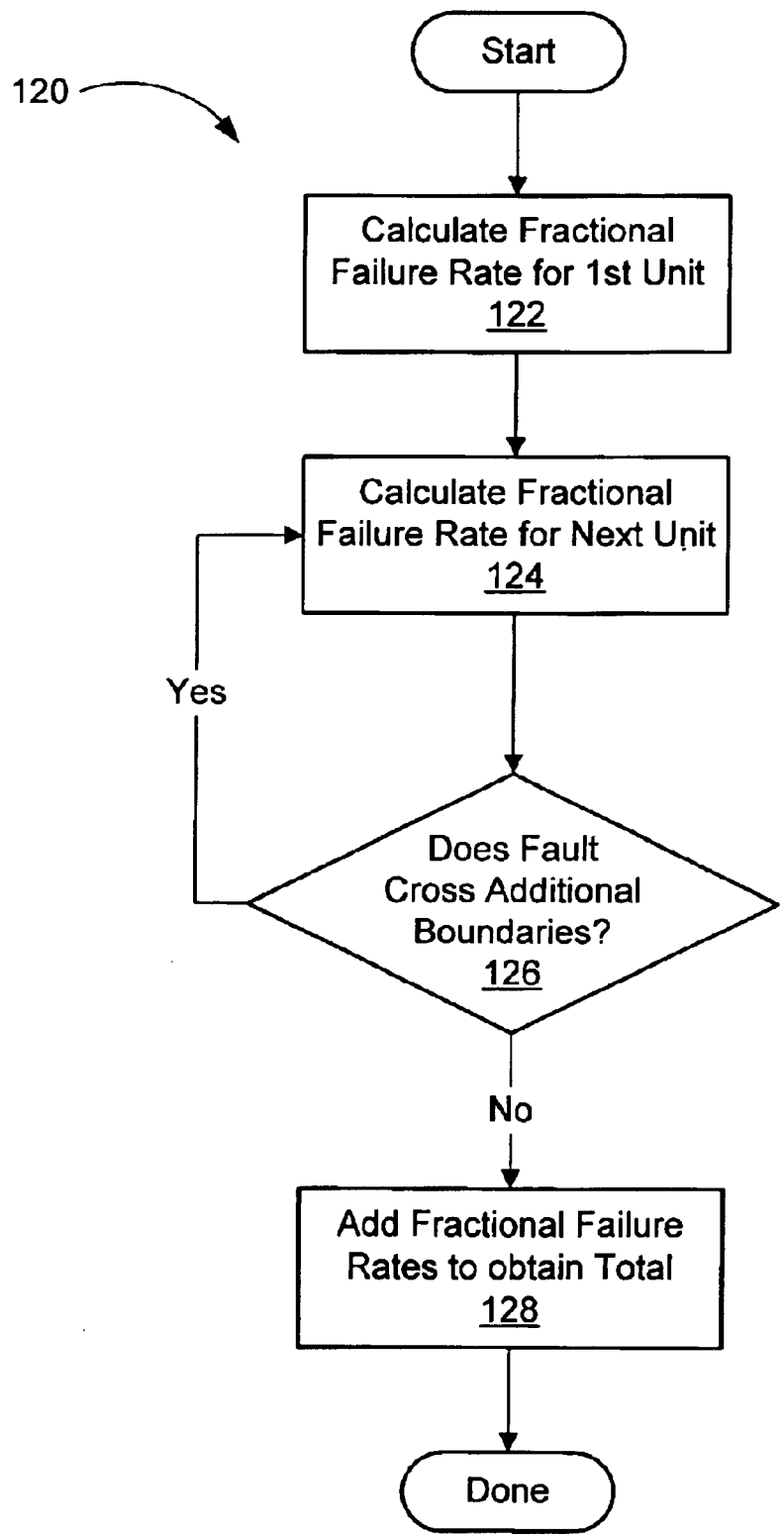
FIG. 3B is a flow diagram of one embodiment of a methodology for determining a fractional failure rate for a fault spanning multiple units.

Moving now to FIG. 3B, a flow diagram of one embodiment of a methodology for determining a fractional failure rate for a fault spanning multiple units is shown. Method 120 begins with the calculation of a fault fractional failure rate for a first unit (122). One example of the calculation of a fault fractional failure rate for a first unit was given in reference to FIG. 3A, and may apply to circuit card 10 of FIGS. 1 and 2.

After the calculating the fractional failure for the first unit, a fractional failure rate for a next unit may be calculated (124). Using circuit card 20 as the next unit, a fractional failure rate may be determined by first calculating its component fractional failure rate for the particular fault. Assuming a total of 252 active pins on IC 22 and a failure rate of 0.3, the component fractional failure rate for circuit card 20 is 0.3*(5/252)=0.006. The bare board fractional failure rate is calculated next. In this example, it is assumed that circuit card 20 has 8 active components and that the board has a failure rate of 0.29, and thus the bare board fractional failure rate is 0.29*(1/8)*(5/252)=0.007.

In addition to calculating the component and bare board fractional failure rates, a connector fractional failure rate may be calculated. For the purposes of this example, it is assumed that connectors 15A and 15B of circuit cards 10 and 20 are complementary pin and socket connectors, with connector 15A providing the socket portion while connector 15B provides the pin portion. It is further assumed that the failure rate of the socket portion of the connector is negligible, thus calculations will be performed only for the pin portion. For pin connector 15B, the pin portion, it is assumed that there are 356 active pins (with 5 pins implicated in the fault), and that the connector has a failure rate of 0.08. The connector fractional failure rate can then be found by multiplying the failure rate by the ratio of implicated pins to the total number of active pins in the connector. Thus, the connector fractional failure rate is 0.08*(5/356)=0.001.

After calculating the fractional failure rate for the second unit, a determination is made as to whether a failure rate must be calculated for another unit (126). If the fault crosses additional boundaries, a fractional failure rate may be calculated for the additional unit (124), and this process may be repeated as many times as necessary.

Once the fractional failure rates have been calculated for each unit, a total (system) fractional failure rate may be calculated for the particular fault. The total fractional failure rate for circuit card 20 may be found by adding its component fractional failure rate, bare board fractional failure rate, and connector fractional failure rate. Adding these figures, we have 0.007+0.001+0.006=0.014. The total fault fractional failure rate for both boards may be calculated by adding their individual fault fractional failure rates, which in this case yields 0.00679+0.014=0.02079.

Using the fractional failure rates for both the individual units as well as the total fractional failure rate may yield additional information that may be useful in determining the likelihood of a particular unit being the source of a fault. Using the example above, in can be seen that for the particular fault for which the fractional failure rate was calculated that there is a 67% chance that circuit card 20 is the source of the fault (0.014/0.02079=0.67, or 67%). For the purposes of this disclosure, this will be referred to as the cause probability. In general, the cause probability may be calculated by the formula:

$$\text{Cause Probability} = \frac{\text{(Unit fractional failure rate)}}{\text{(total fault fractional failure rate)}} \times 100\%$$

Such information may be useful for a technician in troubleshooting a system fault in order to minimize downtime.

Figure 4:
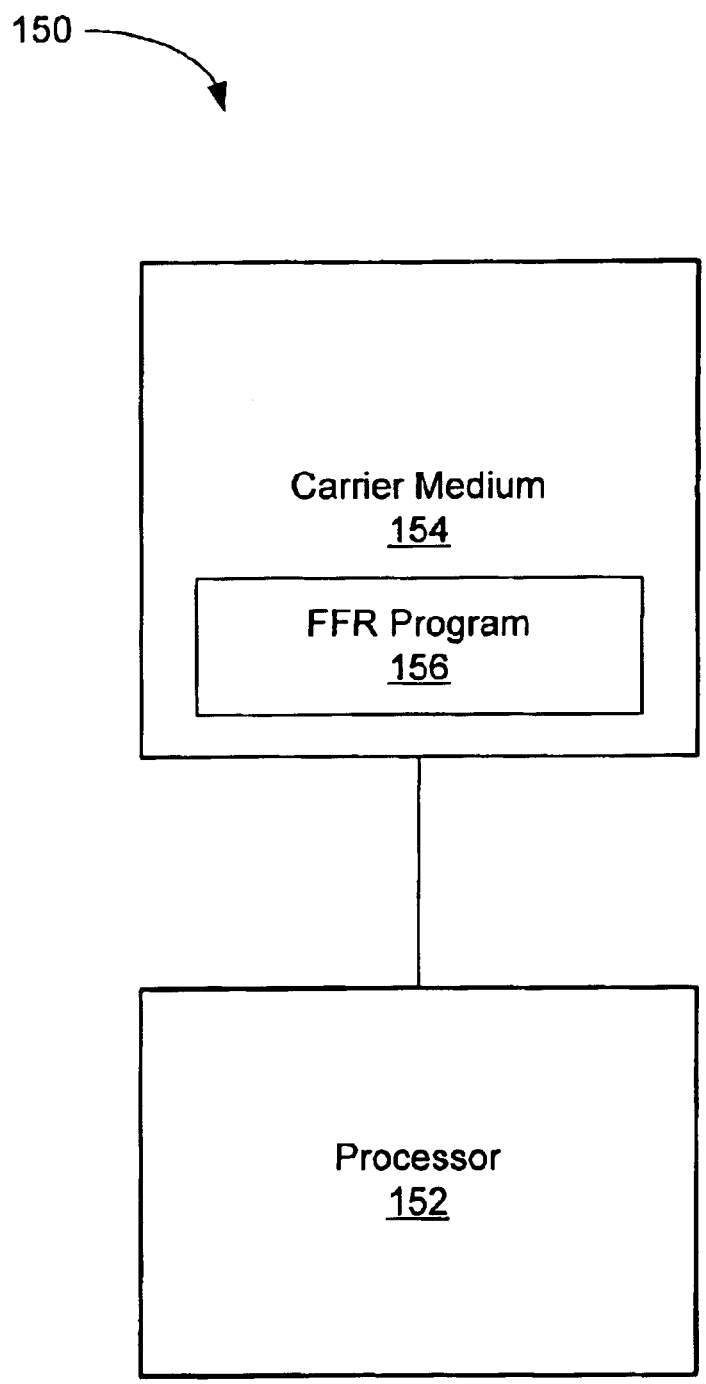
FIG. 4 is a block diagram of one embodiment of a computer system for performing a method for determining a fractional failure rate.

Turning now to FIG. 4, a block diagram of one embodiment of a computer system for performing a method for determining a fractional failure rate is shown. The method described herein may be performed on a wide variety of computer systems and thus other embodiments are possible and contemplated. In the embodiment shown, computer system 150 includes processor 152 which may be coupled to carrier medium 154. Carrier medium 154 may store data and instructions that together encompass fractional failure rate (FFR) program 156 which may execute various embodiments of the methods described above.

Various types of data may be input into computer system 150 for use during the execution of FFR program 156. Such data may include net lists, behavioral information regarding devices of the board/system for which a fractional failure rate is to be calculated, component specifications (e.g. numbers of pins on an IC), and so forth. Such information may be manually input by a user or may be part of a database included or used with FFR program 156. With respect to particular faults, the FFR program may allow a user to input the fault for analysis and fractional failure rate calculation. Alternatively, the execution of FFR program 156 may identify particular faults and automatically determine each of the nets or connections in the system that may be affected by the fault, as well as determining which components may induce the fault. This data may be used by FFR program 156 to calculate fractional failure rates as described above, as well as probabilities implicating a specific component or unit with respect to a given failure.

The computer system and method described may be used by a wide variety of personnel. For example, a reliability engineer could use the system and method to determine MTBF (mean time between failures) for a specific fault in addition to making such calculations for board level and system level failures. Inventory control specialists may use the system and method for determining types of parts (e.g. field replaceable units) to stock for future needs due to failures. System hardware designers may use the system and method to partition hardware fault detection across multiple units in the system which they are designing, and may alter their system designs based on results from performing the method. Field engineers and technicians may use the system and method to aid troubleshooting and fault isolation in an operational system. Test and diagnostic development engineers may use the system and method to assess the fault coverage achieved by their test or diagnostic software or other assessment methodology.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

What is claimed is:

1. A method for determining a fractional failure rate in an electronic system, the method comprising:

identifying a fault in the electronic system;

determining a list of signal connections associated with the fault, wherein the signal connections are present on a first component of a first unit and a second component of a second unit;

determining a unit fractional failure rate for the first unit;

determining a unit fractional failure rate for the second unit, wherein the unit fractional rate for each of the first and second units includes a component fractional failure rate, a connector fractional failure rate, and a circuit carrier fractional failure rate, and wherein determining the connector fractional failure rate for the first unit includes calculating a ratio of the signal connections associated with the fault to a number of active pins on a connector of the first unit and, wherein determining the connector fractional failure rate for the second unit includes calculating the ratio of the signal connections associated with the fault to a number of active pins on a connector of the second unit;

adding the fractional failure rate for the first unit and the fractional failure rate for the second unit to obtain a system fractional failure rate.

2. The method as recited in claim 1, wherein determining the component fractional failure rate for the first unit includes calculating a ratio of a number of the signal connections associated with the fault to a number of active pins on a component of the first unit, and wherein determining the component fractional failure rate for the second unit includes calculating a ratio of a number of the signal connections associated with the fault to a number of active pins on a component of the second unit.

3. The method as recited in claim 2, wherein active pins do not include power pins, ground pins, or unconnected pins.

4. The method as recited in claim 1, wherein the circuit carrier fractional failure rate for the first unit is based on an inverse of a number of active components mounted to a circuit carrier of the first unit and wherein the circuit carrier fractional failure rated for the second unit is based on an inverse of a number of active components mounted to a circuit carrier of the second unit.

5. The method as recited in claim 4, the circuit carrier for each of the first and second units is a printed circuit board (PCB).

6. The method as recited in claim 1, further including determining whether a fault pattern is isomorphic, wherein the fault pattern includes a component type and the signals associated with the fault.

7. The method as recited in claim 6, wherein the integrated circuits are configured to provide an indication of the fault.

8. The method as recited in claim 1, wherein the fault fractional failure rate for the first unit is the sum of the component, the connector and the circuit carrier fractional failure rates for the first unit.

9. The method as recited in claim 1, wherein the fault fractional failure rate for the second unit is the sum of the component, the connector, and the circuit carrier fractional failure rates for the second unit.

10. The method as recited in claim 1, wherein each of the first and second components are integrated circuits (ICs).

11. The method as recited in claim 1 further comprising calculating a cause probability for the first unit and a cause probability for the second unit, wherein the cause probability for an individual unit is 100% times the ratio of the unit fractional failure rate to the total fractional failure rate.

12. A method for determining a fractional failure rate in an electronic system, the method comprising:
   identifying a fault in the electronic system;
   determining a list of circuit connections for signals associated with the fault;
   determining a component fractional failure rate for a component associated with the fault wherein determining the component fractional failure rate includes calculating a ratio of a number of circuit connections associated with the fault to a number of active pins on the component;
   determining a circuit carrier fractional failure rate associated with the fault, wherein the circuit carrier failure rate is amortized based on a number of components mounted to a circuit carrier in the electronic system; and
   determining a fault fractional failure rate, wherein the fault fractional failure rate is determined by adding the component fractional failure rate and the circuit carrier fractional failure, wherein the fault fractional failure rate indicates a percentage of a system failure rate to which the fault contributes.

13. The method as recited in claim 12, wherein determining the fault fractional failure rate further includes determining a connector fractional failure rate for a connector coupled to the circuit carrier, and adding the connector fractional failure rate to the component fractional failure rate and the circuit carrier failure rate in order to obtain the fault fractional failure rate.

14. The method as recited in claim 13, wherein determining the connector fractional failure rate includes calculating a ratio of a number of circuit connections for signals associated with the fault to a number of active signal connections on the connector.

15. The method as recited in claim 12 further including determining whether a fault pattern is isomorphic, wherein the fault pattern includes a component type and the signals associated with the fault.

16. The method as recited in claim 12, wherein the circuit carrier fractional failure rate is determined based on the inverse of the number of active components mounted to the carrier.

17. The method as recited in claim 12, wherein the circuit carrier is a multi-chip module.

18. The method as recited in claim 12, wherein the circuit carrier is a printed circuit board (PCB).

19. The method as recited in claim 12, wherein the circuit carrier is a ceramic hybrid.

20. A computer system comprising:
   a processor;
   a carrier medium coupled to the processor, wherein the carrier medium is configured to store instructions that, when executed by the processor:
   identify a fault in the electronic system;
   determining a list of circuit connections for signals associated with the fault;
   determining a component fractional failure rate for a component associated with the fault, wherein determining the component fractional failure rate includes calculating a ratio of a number of circuit connections associated with the fault to a number of active pins on the component;
   determining a circuit carrier fractional failure rate associated with the fault, wherein the circuit carrier failure rate is amortized based on a number of components mounted to a circuit carrier in the electronic system; and
   determining a fault fractional failure rate, wherein the fault fractional failure rate is determined by adding the component fractional failure rate and the circuit carrier fractional failure, wherein the fault fractional failure rate indicates a percentage of a system failure rate to which the fault contributes.

21. The computer system as recited in claim 20 wherein identifying a fault includes determining whether a fault pattern is isomorphic, wherein the fault pattern includes a component type and the signals associated with the fault.

22. A method for determining a fractional failure rate in an electronic system, the method comprising:
   identifying a fault in the electronic system;
   determining a list of signal connections associated with the fault, wherein the signal connections are present on a first component of a first unit and a second component of a second unit;
   determining a unit fractional failure rate for the first unit;

determining a unit fractional failure rate for the second unit; unit, wherein the unit fractional rate for each of the first and second units includes a component fractional failure rate, a connector fractional failure rate, and a circuit carrier fractional failure rate, and wherein the circuit carrier fractional failure rate for the first unit is based on an inverse of a number of active components mounted to a circuit carrier of the first unit and wherein the circuit carrier fractional failure rated for the second unit is based on an inverse of a number of active components mounted to a circuit carrier of the second unit;

adding the fractional failure rate for the first unit and the fractional failure rate for the second unit to obtain a system fractional failure rate.

23. A method for determining a fractional failure rate in an electronic system, the method comprising:

identifying a fault in the electronic system;

determining a list of signal connections associated with the fault, wherein the signal connections are present on a first component of a first unit and a second component of a second unit;

determining a unit fractional failure rate for the first unit;

determining a unit fractional failure rate for the second unit;

adding the fractional failure rate for the first unit and the fractional failure rate for the second unit to obtain a system fractional failure rate; and calculating a cause probability for the first unit and a cause probability for the second unit, wherein the cause probability for an individual unit is 100% times the ratio of the unit fractional failure rate to the total fractional failure rate.

* * * * *

UNITED STATES PATENT AND TRADEMARK OFFICE
CERTIFICATE OF CORRECTION

PATENT NO. : 6,856,939 B2
DATED : February 15, 2005
INVENTOR(S) : Everts et al.

It is certified that error appears in the above-identified patent and that said Letters Patent is hereby corrected as shown below:

Column 9,
Line 2, please delete "unit; unit, wherein the unit" and substitute -- unit, wherein the unit --.

Signed and Sealed this

Twelfth Day of July, 2005

JON W. DUDAS
*Director of the United States Patent and Trademark Office*